United States Patent [19]

Stillie

[11] Patent Number: 4,636,018

[45] Date of Patent: Jan. 13, 1987

[54] ELASTOMERIC ELECTRICAL CONNECTOR

[75] Inventor: Donald G. Stillie, Winston-Salem, N.C.

[73] Assignee: AMP Incorporated, Harrisburg, Pa.

[21] Appl. No.: 741,650

[22] Filed: Jun. 5, 1985

[51] Int. Cl.[4] .............................................. H01R 9/09
[52] U.S. Cl. ............................... 339/17 M; 339/61 M
[58] Field of Search ............. 339/17 F, 17 M, 17 LM, 339/59 M, 61 M

[56] References Cited

U.S. PATENT DOCUMENTS

| 3,858,958 | 1/1975 | Davies | 339/17 LM |
| 3,985,413 | 10/1976 | Evans | 339/17 LM |
| 4,057,311 | 11/1977 | Evans | 339/17 M |

OTHER PUBLICATIONS

Becon Connector, "Becon 90° Double 10" advertisement, Brown Engineering Co., 12-1961.

Electronic Design, Becon Printed Circuit Connector, 11-1961, p. 39.

Primary Examiner—Neil Abrams
Attorney, Agent, or Firm—Robert W. Pitts; Eric J. Groen

[57] ABSTRACT

An electrical connector assembly comprises a unitary elastomeric body member having a plurality of electrical conductors encircling a cylindrical body portion. The conductors are defined on the exterior surface of an insulating film which is affixed around a portion of the elastomeric body member. Integral elastomeric base members extend outwardly from the ends of the cylindrical body portion and outwardly beyond the film-conductor laminate. Annular support sleeves are inserted within the integral elastomeric base members and interconnection is established to conductive pads on substrates such as printed circuit boards.

18 Claims, 11 Drawing Figures

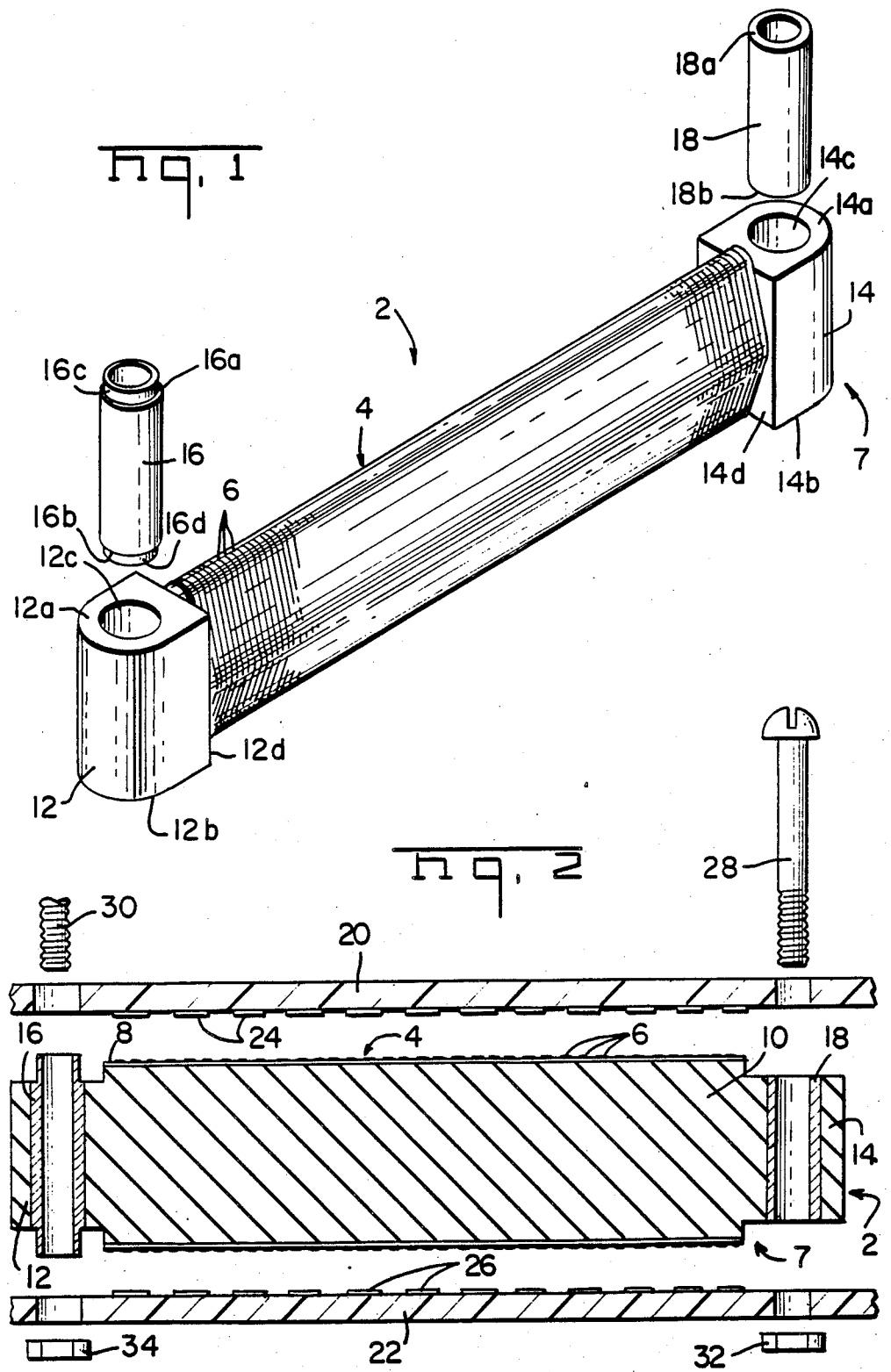

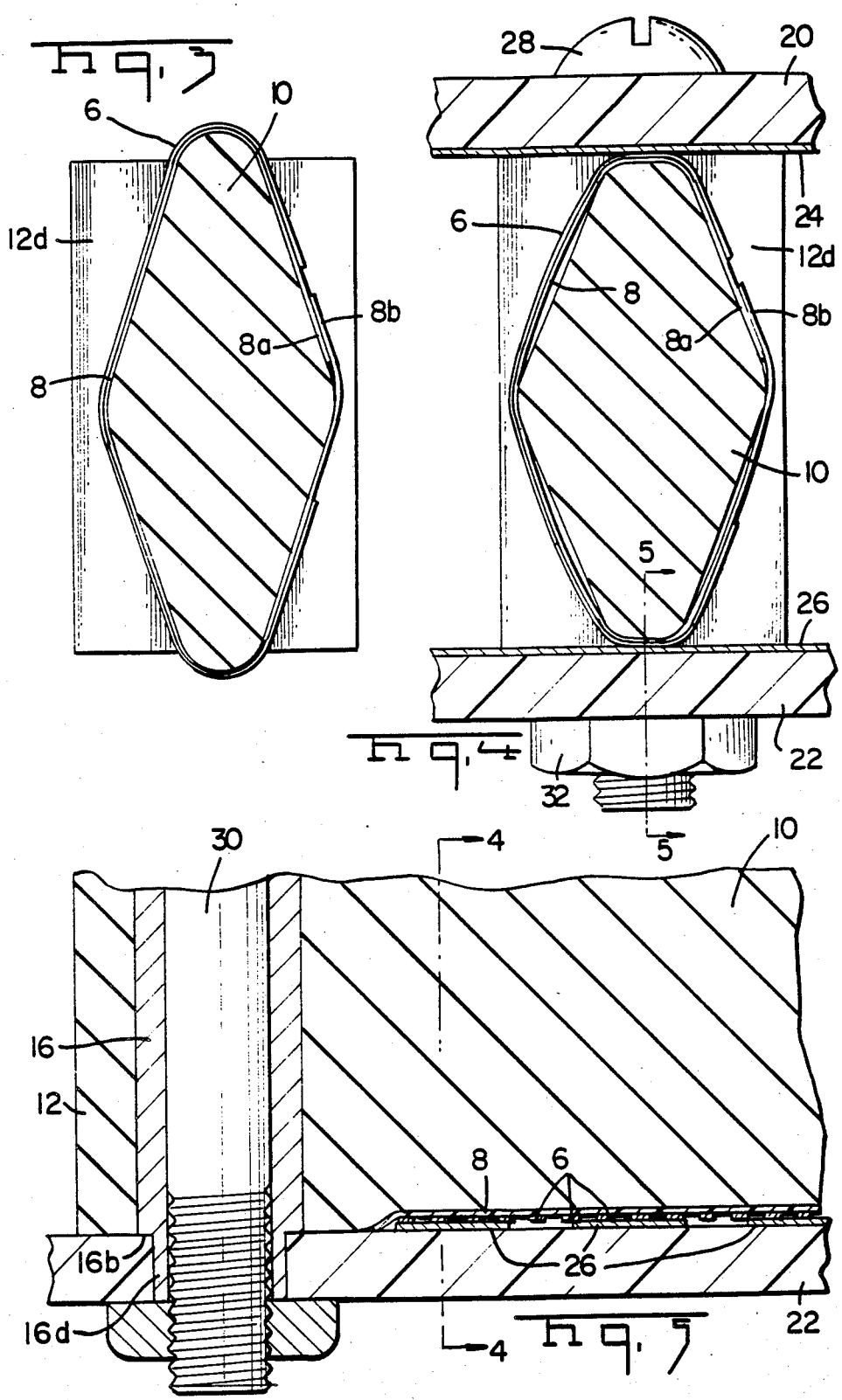

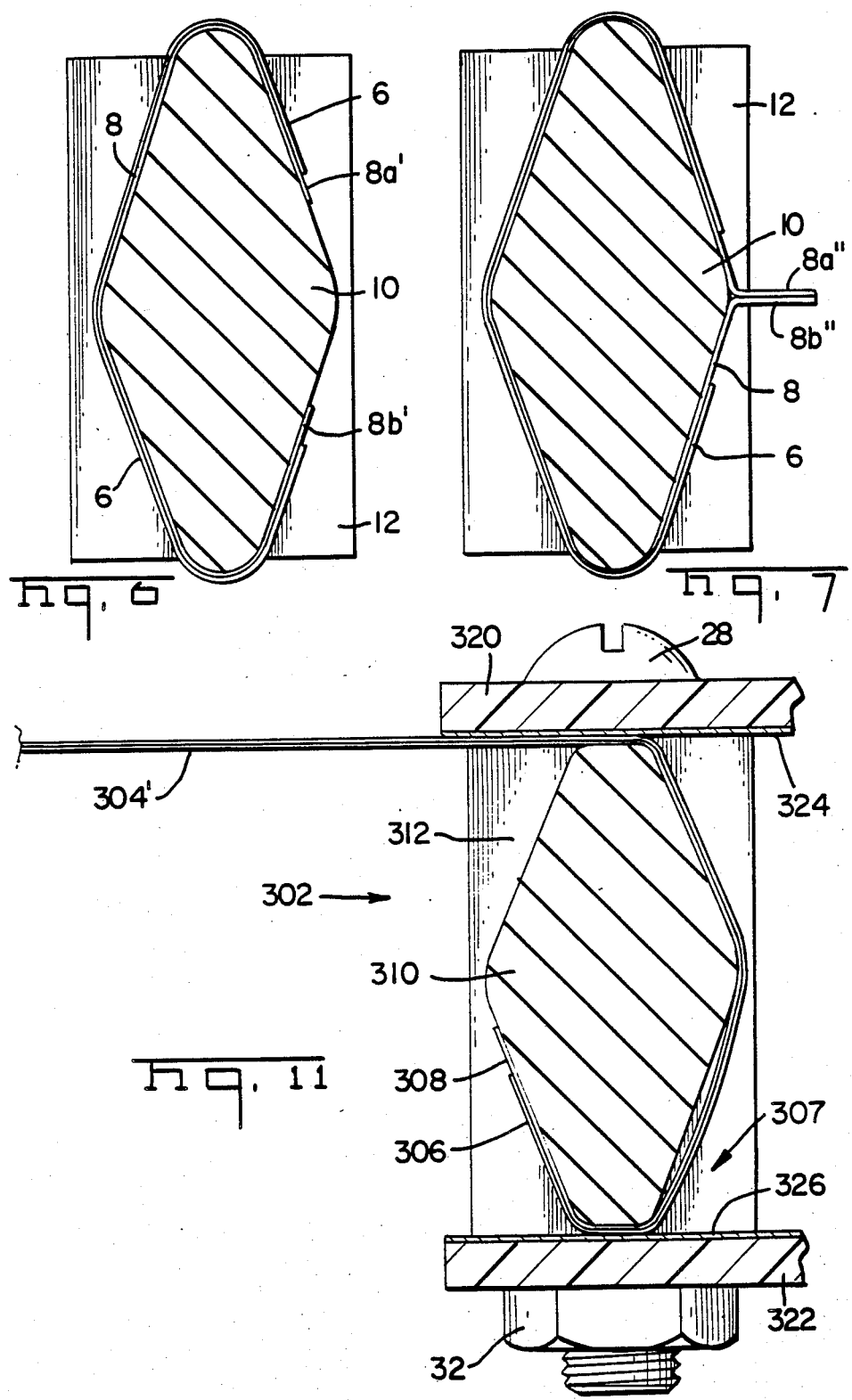

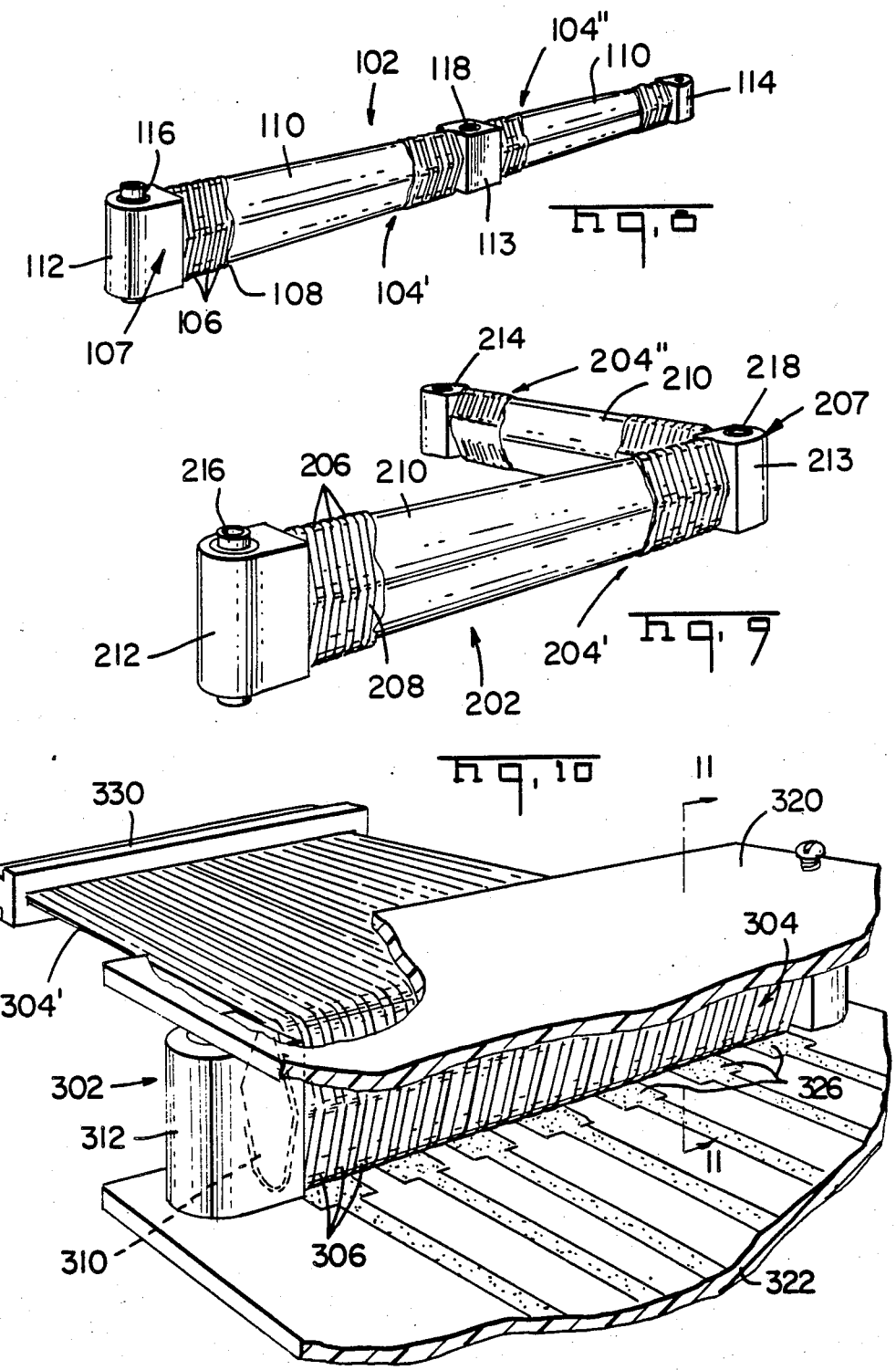

ELASTOMERIC ELECTRICAL CONNECTOR

BACKGROUND OF THE INVENTION

1. Field of the Invention

This invention relates to an electrical connector for interconnecting circuitry on a substrate and more particularly it relates to an electrical connector having an elastomeric body which can be positioned between two panel members such as printed circuit boards to interconnect corresponding aligned pads on the printed circuit boards

2. Description of the Prior Art

U.S. Pat. No. 3,985,413 discloses a miniature electrical connector which can be positioned between parallel spaced apart substrates, such as printed circuit boards to interconnect circuitry on each of the printed circuit boards. The connector consists of a generally cylindrical elastomeric body having a thin conventionally stable flexible film wrapped around the elastomeric body. Circuit traces are defined on the flexible film and face outwardly. When the elastomeric body is compressed between the two substrates or printed circuit boards, the elastomeric body supplies sufficient compressive force to establish an electrical connection with exposed pads on the printed circuit boards.

The electrical connector disclosed in U.S. Pat. No. 3,985,413 employs a film of polymeric material which is wrapped around the elastomeric body. The free ends of the film are joined together to maintain the film in surrounding relationship to the elastomeric body. The film is not attached directly to the elastomeric body, thus permitting relative movement therebetween when the body is placed under compressive loads.

U.S. Pat. No. 3,985,413 only discloses the elastomeric connector and does not describe the manner in which that elastomeric connector is mounted to interconnect separate circuit components, such as printed circuit boards. In use, that miniature electrical connector must be positioned within an insulating housing which is in turn attached to the electrical components. When used to interconnect printed circuit boards, that miniature elastomeric connector is positioned within a longitudinally extending recess in an insulating housing and the insulating housing is attached directly to the printed circuit boards. Although the circuit traces on the exterior of that miniature electrical connector have a width less than the spacing of conventional contact pads on printed circuit boards, in order to prevent easy alignment, it is still necessary to rely upon the housing to position the connector relative to the printed circuit board.

There are several drawbacks to the use of a separate connector of this type in conjunction with a separate housing. Foremost among these disadvantages is the additional manufacturing costs due primarily to the necessity of actual assembling the elastomeric connector in the housing. An additional problem which has been encountered with connectors of this type is that such connectors have not heretofore lent themselves to establishing an interconnection between the relatively widely spaced printed circuit boards. For example, such connectors have not proven suitable for interconnection of circuitry on boards spaced apart on the order of 0.500 inches or more. When a circular connector of the type disclosed in U.S. Pat. No. 3,985,413 is used for such widely spaced boards. The diameter of the circular elastomeric member occupies an excessive amount of space. Connectors of the type shown in that patent but having an oval cross section have been employed to save space. However, a limit is reached in which the major axis of the oval cross section exceeds the minor access dimension by such a degree that proper alignment and stability of the connector becomes difficult to maintain.

One example of an electrical connector which was in part intended for interconnecting relatively widely spaced boards is disclosed in U.S. Pat. No. 4,057,311. That connector also employs a thin film having circuit traces disposed on its exterior and uses elastomeric members to establish contact pressure when the compressive force is applied thereto. The miniature electrical connector disclosed in that patent also employs a central rigid body having a trough-like recess in which the elastomeric members are positioned. The thin film circuitry is, however, positioned along the rigid body and is to be held in position by a plurality of elastomeric members spaced side by side in the common recess. It can be appreciated that the assembly costs encountered with elastomeric connectors of more conventional construction would be magnified for the electrical connector shown in U.S. Pat. No. 4,057,311, at least in part because of the large number of separate parts which must be employed.

SUMMARY OF THE INVENTION

The preferred embodiment of this invention comprises an electrical connector for interconnecting circuitry on at least one substrate to corresponding circuitry, either on a separate substrate or in a separate electrical component. The substrate has conductive elements such as contact pads disposed on one surface thereof as part of the circuitry on the substrate. These pads can be interconnected to conductive traces also located on the surface of the substrate or printed circuit board. Alternatively these pads can be interconnected to other circuitry on the substrate, such as circuits on a multilayer printed circuit board in which the circuits are positioned between insulating layers. The electrical connector has a body which is formed of elastomeric material such as silicone rubber. The body has at least one cylindrical proportion which is integral with base portions on either end of the cylindrical portion. In the preferred embodiment of this invention, the cylindrical portion has a diamond cross section. A pair of support members can be inserted in engagement with each base member. In the preferred embodiment of this invention, the support members comprise annular sleeves which are inserted in companion bores in the elastomeric base members. The bores extend perpendicular to the axis of the cylindrical portion of the body. Each support member or sleeve has a height which is less than the undeflected height of the cylindrical body portion. When a compressive force is applied to the cylindrical body portion, for example, when two printed circuit boards are secured together and spaced apart by a distance less than the undeflected height of the cylindrical body portion, the support members act as a stop to limit the amount of compressive force applied. Each support member engages each of the oppositely positioned printed circuit boards in this configuration.

Electrical contact is established by a plurality of conductors or conductive traces disposed on the surface of the cylindrical body portion. In the preferred embodiment of this invention, these conductors are defined on the exterior of a polymeric film which surrounds and is adhered to the cylindrical body portion. The conductors can be disposed in registry with the conductive elements or conductive pads on the substrate or on the substrates. Proper alignment between the conductors is maintained by engagement of one or more of the support members or sleeves with each substrate. For example, a sleeve having an upwardly projecting surface can be inserted into a hole on the printed circuit board. A separate abutting surface below the upwardly projecting surface on the sleeve can engage the face of the printed circuit board to prevent further compression being applied to the elastomeric body.

BRIEF DESCRIPTION OF THE DRAWINGS

FIG. 1 is a perspective view of a one-piece elastomeric connector in accordance with this invention.

FIG. 2 is a sectional view illustrating the orientation of the one-piece elastomeric electrical connector relative to two printed circuit boards.

FIG. 3 is a sectional view showing the flexible film mounted on the cylindrical body of the one-piece connector.

FIG. 4 is a view similar to FIG. 3 but showing the configuration of the elastomeric connector under compressive loads applied by oppositely facing printed circuit boards.

FIG. 5 is a sectional view illustrating the contact between conductors on the film surface and contact pads on one printed circuit board.

FIG. 6 is an alternate embodiment in which both ends of the flexible film are attached directly to the cylindrical body.

FIG. 7 is another embodiment in which the ends of the flexible film are attached to each other and extend to form a tail.

FIG. 8 is an embodiment of the invention in which the elastomeric body comprises a plurality of cylindrical body portions and elastomeric bases.

FIG. 9 is a view similar to FIG. 8 but showing a right angle configuration of a multiple connector assembly.

FIG. 10 is a view of another embodiment in which the connector has an extended tail attached to a separate connector.

FIG. 11 is a sectional view of a connector shown in FIG. 10.

DETAILED DESCRIPTION OF THE PREFERRED EMBODIMENTS

The electrical connector comprising the preferred embodiment of this invention comprises a one-piece elastomeric body consisting of a cylindrical central portion 10 and base portions 12 and 14 on either end. A flexible film subcomponent 4 comprising a dielectric polymeric film 8 having a plurality of conductors or conductive traces 6 defined on the exterior thereof is positioned in surrounding relationship to the central cylindrical portion 10 of the elastomeric body. In the preferred embodiment of this invention, the elastomeric body 7 comprises a one-piece molded silicone rubber body. The central insulative film can comprise any of a number of conventional polymeric films such as a polyimide-amide film. The conductive traces 6 can comprise etched metallic traces such as etched copper traces deposited on the exterior of the film or can comprise conductive ink traces screen printed onto the exterior of the film. The film conductor laminate can also be fabricated in a conventional manner by casting a polymeric film onto one surface of a conductive sheet and then selectively etching the conductor 6.

As shown in FIG. 2, the connector assembly 2 comprising the film-connector laminate 4 and the elastomeric body 7 are adapted to be directly mounted to one or more substrates such as printed circuit boards 20 and 22. The conductor 2 does not require the use of a separate insulating housing for mounting the connector to the printed circuit boards. The one-piece molded elastomeric body 7 includes a central cylindrical portion 10 with integral elastomeric base members 12 and 14 extending outwardly from the cylindrical body portion 10.

Each of the bases 12 and 14 extending outwardly from the cylindrical body portion 10 has a cylindrical bore extending completely therethrough from an upper face 12a to a lower face 12b, respectively 14a and 14b in base 14. The bore 12c extends generally perpendicular to the axis of the cylindrical body portion 12. The cylindrical body portion 10 joins the integral base members 12 and 14 at internally directed faces 12b and 14b which can serve to position the film-conductor substrate 4 around the central body portion 10. Since the entire elastomeric body 7 is formed by a single molding, the outwardly extending base members 12 and 14 are formed of the same material as the central cylindrical body portion 10 to form a unitary elastomeric structure 7. As shown most clearly in FIG. 2, the height of the cylindrical body portion 10, which in the preferred embodiment has a diamond-shaped cross section, is greater than the height of base members 12 and 14 when measured from between the upper and lower surfaces 12a and 12b or 14a and 14b respectively.

Support sleeves 16 and 18 formed of a material which is substantially more rigid than the elastomeric material forming body 7 are dimensioned to be received within the bores 12c and 14c respectively. Each of the sleeves 16 and 18 comprise a generally annular member having axially facing shoulders 16a and 16b, or 18a and 18b adjacent opposite ends thereof. These end surfaces 16a and 16b or 18a and 18b are adapted to engage a surface of the substrate or the printed circuit boards as will be described in more detail subsequently. Annular support sleeve 16 differs from annular support sleeve 18 in that a separate annular surface or extension 16c is formed axially outwardly from the axially facing surface 16a. A similar surface 16d extends outwardly from axially facing surface 16b. Annular surfaces 16c and 16d have an outer diameter less than the outer diameter of the sleeve 16 along the greater portion of its length. These annular surfaces 16c and 16d are dimensioned for receipt in holes in a printed circuit board and serve to precisely position the connector assembly relative to the printed circuit board or other substrate.

FIGS. 3 and 4, when considered together demonstrate the manner in which the central body portion 10 of the elastomeric connector is deflected upon the application of a compressive force to this diamond-shaped cross-sectional portion. When such compressive force is applied, the conductors 6 on the exterior of the insulating film 8 establish intimate contact with the conductive elements or pads 24 and 26 defined on the surface of printed circuit boards 20 and 22. Since conventional circuit boards often employ conductive pads such as 24 and 26 which have a noble metal coating, a suitable electrical connection can be formed in this manner.

It will be appreciated that the support sleeves 16 and 18 not only serve to position the connector but also provide a stop to limit the amount of compressive load which can be applied to the connector. Surface 16a, 16b, 18a and 18b serve to engage the inwardly facing surfaces of the printed circuit boards 20 and 22 to prevent continued compression of the elastomeric member. Thus the fastening members such as bolts 28 and 30 attach in a conventional manner to nuts 32 and 34, which serve to maintain a compressive load on the elastomeric connector 2, cannot be used to apply excessive compressive loads. These excessive compressive loads might lead to deterioration of the elastomer. In this manner the loads applied to the elastomer can be regulated to essentially the design criteria.

The film-conductor laminate which serves as the actual interconnect between substrates, is positioned in surrounding relationship to the cylindrical body portion 10. In the preferred embodiment of this invention, a first end 8a of the insulative film 8 is attached to one face of the cylindrical body portion 10 by a conventional adhesive extending along the length of leading edge 8a. The opposite edge 8b is then attached to the exterior of the edge 8a again using the same type of adhesive. A pressure sensitive, polymerized silicone adhesive is used to provide adherence to the silicone rubber member.

Each base 12 and 14 has an inwardly facing planar surface, 12d and 14d respectively. These surfaces can be used to align the film-conductor laminate 4 surrounding the elastomeric body 10. With the film-conductor laminate thus aligned in this manner, the individual conductive traces will be aligned to contact oppositely facing aligned conductor pads, such as aligned pads 24 and 26. The conductive traces may be defined such that a plurality of conductors will contact each pad as with the connector disclosed in U.S. Pat. No. 3,985,413. However, the film conductor laminate 4 is aligned by engagement with surfaces 12d and 14d, and the elastomeric body is aligned with the printed circuit board by keyed support member 16. Therefore, the conductors 6 on film 8 can be individually aligned with conductor pads 24 and 26. Thus each conductor 6 can be, in effect, dedicated to an individual pair of corresponding conductor pads. Therefore the cross-sectional area of each conductor 6 can be relatively larger and its current carrying capacity correspondingly greater.

In the preferred embodiment of this invention, the insulating film 8 is not attached to the cylindrical body portion 10 along its entire surface. As shown in FIG. 4, relative movement between the elastomeric body 10 and the film 8 is provided such that the film 8 need not deflect in the same manner as the elastomer, and relative movement can occur between the film and the elastomer and the application of compressive loads. This reduces the stresses placed upon the adhesive and upon both the flexible film and the elastomer.

FIGS. 6 and 7 illustrate alternative embodiments in which the film is bonded or secured to the elastomeric body 10 in a different manner. As shown in FIG. 6, both the leading edge 8a' and the trailing edge 8b' can be bonded directly to the silicone rubber body 10. It should therefore be apparent that the film conductor laminate need not completely encircle the elastomeric body portion 10. FIG. 7 demonstrates still another manner in which the flexible film is secured to the elastomeric body. As shown in FIG. 7, the opposite edges 8a" and 8b" of the film are secured to each other rather than securing the film directly to the body of elastomeric material.

FIGS. 8 and 9 demonstrate extensions of the connector as shown in FIG. 1. Both the connector 102 shown in FIG. 8 and the connector 202 shown in FIG. 9 represent connectors in which multiple film laminate elements are secured around separate cylindrical body portions of the same one-piece molded elastomeric body. For example, two film-conductor laminates 104' and 104" are positioned on opposite sides of an intermediate base 113 as shown in FIG. 8. The right angle connector set assembly shown in FIG. 9 also has two film laminates 204' and 204" on opposite sides of the intermediate base portion 213. The intermediate base portions 113 and 213 are provided so that precise spacing of the substrates and printed circuit boards can be maintained at regular intervals along the length of the connectors. This is necessary because the convention of printed circuit boards have a tendency to warp or deform in use thus making it difficult to maintain an adequate connection. As shown in FIGS. 8 and 9, the keying annular sleeves 116 and 216 are still only provided in one of the multiple elastomeric base members.

FIG. 10 demonstrates still another embodiment of an electrical connector 302 which in this case has an extended tail 304' leading to a separate connecting member 310. As shown in FIG. 10 and in FIG. 11, the film laminate is again positioned around a cylindrical body portion 310 to establish interconnection with conductive pads on two spaced apart substrates or circuit boards. The first end of the film laminate is again adhesively secured to the elastomeric body and the extended tail 304' defining the opposite end is not attached to the elastomeric body but extends beyond the elastomeric body to a separate location. The other connector 330 shown in FIG. 10 is intended to be representative only. Any conventional connecting means 330 can be employed at this end.

It can be seen that this invention can be employed in any of a number of different configurations and the following claims should in no means be limited only to the specific configurations depicted herein for illustrative purposes.

I claim:
1. An electrical connector for interconnecting circuitry on a substrate to corresponding circuitry, the substrate having conductive elements disposed on one surface thereof as part of the circuitry on the substrate, the connector comprising:
  a body formed of an elastomeric material and having an elastomeric cylindrical portion and elastomeric base members formed as an integral continuous section of material with the cylindrical portion, the base members extending outwardly from the ends of the cylindrical portion;
  support members extending through each base member, each support member being more rigid than the elastomeric base, each support member having a vertical height less than the undeflected vertical height of the cylindrical body portion; and
  a plurality of conductors disposed on the surface of the cylindrical body portion, each being disposable in registry with the conductive elements on the substrate, whereby the body can be attached to the substrate with the support members comprising means for aligning conductors with corresponding conductive elements, the conductors being urged into contact with the conductive elements upon application of a compressive force applied through the substrate to the elastomeric body, the support members comprising means for limiting the compressive force applied through the substrate to the body.

2. The electrical connector of claim 1 wherein the height of each integral base is less than the height of the cylindrical portion.

3. The electrical connector of claim 1 wherein each support member is inserted in engagement with an opening in the corresponding base, the opening extending perpendicular to the axis of the cylindrical portion.

4. The electrical connector of claim 3 wherein the opening comprises a bore extending through the base.

5. The electrical connector of claim 4 wherein each support member comprises an annular member insertable through the corresponding bore, the support members comprising means for receiving a fastening member extending therethrough for attaching the substrate to a separate member exerting compressive force on the elastomeric body.

6. The electrical connector of claim 1 wherein the conductors comprise conductive traces defined on a flexible insulating film at least partially surrounding the cylindrical body portion and extending between bases on opposite ends of the cylindrical body portion.

7. The electrical connector of claim 6 wherein the conductive traces comprise a conductive material etched on the surface of the insulating film.

8. The electrical connector of claim 6 wherein the conductive traces comprise conductive ink traces defined on the surface of the film.

9. The electrical connector of claim 6 wherein each base defines a planar surface adjacent the cylindrical portion, the insulating film engaging the planar surfaces for alignment between each base.

10. The electrical connector of claim 6 wherein at least one end of the film is affixed to the cylindrical body portion by an adhesive extending along the axial length of the cylindrical body portion.

11. The electrical connector of claim 10 wherein the opposite end of the insulating film is adhered to the insulating film adjacent the first mentioned end by an adhesive extending along the axial length of the cylindrical body portion.

12. The electrical connector of claim 10 wherein the adhesive comprises a pressure sensitive adhesive.

13. The electrical connector of claim 1 wherein the elastomeric body comprises a one-piece molded body.

14. The electrical connector of claim 13 wherein the elastomeric body is fabricated from a silicone rubber.

15. The electrical connector of claim 13 wherein the body comprises a plurality of separate cylindrical body portions including an intermediate integral base member between adjacent cylindrical body portions, a support member being inserted in each intermediate base member.

16. The electrical connector of claim 1 wherein the cylindrical body portion has a diamond-shaped cross section.

17. The electrical connector of claim 1 wherein at least one said support member has first end surfaces for engaging the substrate and an annular surface extending thereabove for registry in a hole in the substrate.

18. An electrical connector for interconnecting circuitry on two panel members when positioned in mutual opposition, each panel member having conductive pads on one surface thereof as part of the circuitry on the panel members, the connector comprising means for interconnecting conductive pads in opposed alignment, and further comprising:

a body formed of an elastomeric material and having a cylindrical portion and an integral base at each end of the cylindrical portion, each base having end surfaces facing the panel members and an opening extending between the end surfaces;

annular support members inserted in the openings in each base, each support member being more rigid than the elastomeric base and having a height less than the undeflected height of the cylindrical body portion;

a plurality of conductors disposed on the surface of the cylindrical body portion, each being disposable in registry with corresponding conductive pads on both panel members, and fastening means for attaching the body to each panel member, the fastening means further comprising means for applying a compressive force to the elastomeric body, the support members comprising means for limiting the compressive force applied to the body.

* * * * *